United States Patent [19]
Shimoji

[11] Patent Number: 5,357,134
[45] Date of Patent: Oct. 18, 1994

[54] NONVOLATILE SEMICONDUCTOR DEVICE HAVING CHARGE TRAP FILM CONTAINING SILICON CRYSTAL GRAINS

[75] Inventor: Noriyuki Shimoji, Kyoto, Japan

[73] Assignee: Rohm Co., Ltd., Kyoto, Japan

[21] Appl. No.: 200,313

[22] Filed: Feb. 23, 1994

Related U.S. Application Data

[63] Continuation of Ser. No. 964,211, Oct. 20, 1992, abandoned.

[30] Foreign Application Priority Data

Oct. 31, 1991 [JP] Japan .............................. 3-313313
Oct. 31, 1991 [JP] Japan .............................. 3-313314
Oct. 31, 1991 [JP] Japan .............................. 3-313315
Oct. 31, 1991 [JP] Japan .............................. 3-313318

[51] Int. Cl.$^5$ ............................................ H01L 29/78
[52] U.S. Cl. .................................... 257/325; 257/314
[58] Field of Search ............... 257/325, 324, 316, 64; 437/983

[56] References Cited

U.S. PATENT DOCUMENTS

| | | | |
|---|---|---|---|
| 3,878,549 | 4/1975 | Yamazaki et al. | 257/325 |
| 4,162,176 | 7/1979 | Tsuda | 257/316 |
| 4,282,540 | 8/1981 | Ning et al. | 257/316 |
| 4,735,919 | 4/1988 | Faraone | 257/316 |
| 5,031,010 | 7/1991 | Mikata et al. | 257/316 |

Primary Examiner—Robert Limanek
Attorney, Agent, or Firm—Brumbaugh, Graves, Donohue & Raymond

[57] ABSTRACT

A tunnel oxide film 12 is formed on a silicon substrate 11 and a polysilicon film 16 is deposited thereon. Then, an impurity such as phosphorus or the like is doped into the polysilicon film 16 and the polysilicon film 16 is subjected to thermal oxidation. As a result, a charge trap film 15 in which silicon grains 13 in the inside of the polysilicon film 16 are coated with a thermal oxide film 14 is obtained. If necessary, a multilayer charge trap film 15 is obtained by repetition of the foregoing steps. Since the thermal oxide film 14 has an excellent insulating property compared with an oxide film obtained by a sputtering or CVD method and therefore the charge trap film 15 has a high dielectric withstanding voltage. Further, since the silicon grains 13 coated with the thermal oxide film 14 have a deep trap level, an improved signal charge holding property can be obtained. Thereby, it is provided a nonvolatile semiconductor storage device comprising a charge trap film having a deep trap level and an improved dielectric withstanding voltage.

6 Claims, 6 Drawing Sheets

FIG. 8A (NON-CONDUCTIVE STATE)

FIG. 8B (CONDUCTIVE STATE)

NONVOLATILE SEMICONDUCTOR DEVICE HAVING CHARGE TRAP FILM CONTAINING SILICON CRYSTAL GRAINS

This is a continuation of application Ser. No. 07/964,211, filed on Oct. 20, 1992, now abandoned.

BACKGROUND OF THE INVENTION

1. Field of the Invention

The present invention relates to a charge trap film to be used in a nonvolatile semiconductor storage device and a producing method thereof. Furthermore, the present invention relates to a nonvolatile semiconductor storage device provided with a charge trap film and a producing method thereof.

2. Description of Conventional Art

Conventionally, as a nonvolatile semiconductor storage device in which charges are held in a charge trap film to store information, a memory cell having an MNOS (metal-nitride-oxide-semiconductor) structure or an MONOS (metal-oxide-nitride-oxide-semiconductor) structure is known.

Figure 10:
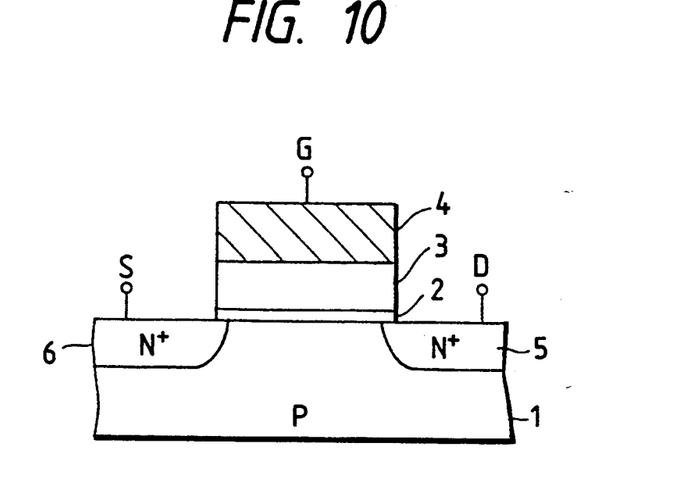
FIG. 10 is a section showing the structure of an MNOS device as a conventional example.
Figure 11:
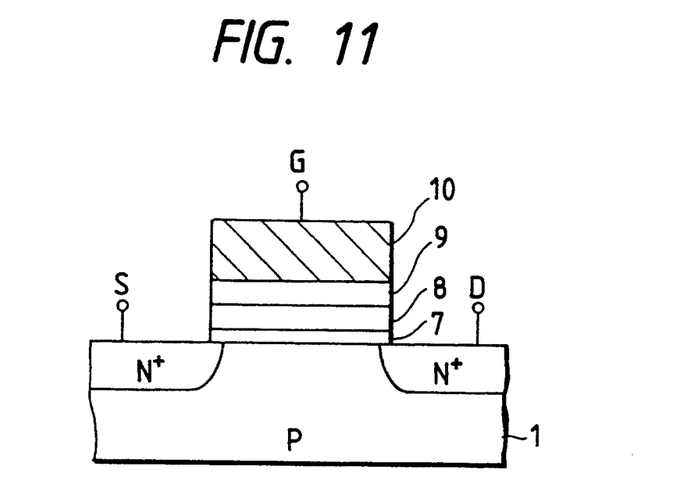
FIG. 11 is a section showing the structure of an MONOS device as a conventional example.

As shown in FIG. 10, the MNOS-type memory cell has a gate structure in which a tunnel oxide film 2, a silicon nitride film 3, and a gate electrode 4 are stacked, for example, on a P-type silicon substrate 1, and drain and source diffusion layers 5 and 6 which are N+ regions are formed on both sides of the gate structure in the substrate. The MONOS-type memory cell, on the other hand, has a gate structure in which a tunnel oxide film 7, a silicon nitride film 8, a top oxide film 9, and a gate electrode 10 are stacked as shown in FIG. 11.

In those memory cells, the silicon nitride film 3 or 8 is used as a charge trap film for storing signal charges, and a positive high voltage is applied to the gate electrode 4 or 10 for writing, so that electrons tunnel from a channel region of the substrate 1 through the tunnel oxide film 2 or 7 so as to be injected into the silicon nitride film 3 or 8 to be trapped therein. Here, the silicon nitride film 3 or 8 acting as the charge trap film is formed by a CVD (chemical vapor deposition) method, and specifically, the silicon nitride film 3 or 8 is produced by making an $SiH_4$ gas or $SiH_2Cl_2$ gas react with an $NH_3$ gas in an atmosphere of 700°–900° C.

In the conventional examples having such a structure, however, there has been a problem that in a silicon nitride film acting as a charge trap film, charges are apt to be de-trapped because the trap level is so shallow that the signal charge holding property is poor.

Then, it is proposed in Japanese Patent Application that a semiconductor storage device using, as a charge trap film, a film (so-called Si rich oxide film) containing a mixture of conductive silicon and insulating silicon dioxide. An Si rich oxide film is superior in signal charge holding property because the film has a deep level theoretically. Since the foregoing proposed Si rich oxide film is formed through a sputtering or CVD method, however, there has been a problem that it is difficult to control an insulating property between silicon crystal grains (hereinafter referred to as "silicon grains") in the oxide film. Particularly in the case where the Si rich oxide film is made thin so as to make a wiring voltage low, an inconvenient phenomenon that electrons injected in the Si rich oxide film at the time of signal charge writing pass through as they are to a gate electrode has sometimes occurred.

SUMMARY OF THE INVENTION

The present invention has been achieved in view of the foregoing circumstances, and an object of the present invention is to provide a nonvolatile semiconductor storage device in which a charge trap film having a deep trap level and an excellent dielectric withstanding voltage is formed, and a producing method thereof.

In order to achieve the above object, according to the present invention, the following configuration is provided.

That is, in a nonvolatile semiconductor storage device having a gate structure constituted by an insulating film, a charge trap film, and a conductive film which films are stacked on a substrate, and having drain and source diffusion layers in the substrate on the opposite sides of the gate structure, whereby charges are held in the charge trap film to thereby store information, the charge trap film includes silicon crystal grains in a polysilicon film, the silicon crystal particles being coated with a thermal insulating film.

Furthermore, the method of producing a nonvolatile semiconductor storage device for storing information by holding charges in a charge trap film, comprises the steps of: forming an insulating film on a semiconductor substrate; depositing a polysilicon film on the insulating film; and coating silicon crystal particles in the polysilicon film with a thermal insulating film; depositing a conductive layer on the polysilicon film; forming a gate structure by patterning the insulating film, the polysilicon film and the conductive layer; and forming drain and source diffusion layers in the substrate on the opposite sides of the structure as a mask.

According to the present invention, it is possible to obtain a semiconductor storage device having a charge trap film in which silicon crystal particles in a polysilicon film are coated with a thermal insulating film. The thermal insulating film covering the silicon crystal particles in the polysilicon film is excellent in film quality compared with an insulating film obtained by a sputtering or CVD method so that it has a high dielectric with stand voltage. Further the silicon crystal particles coated with the thermal insulating film have a deep trap level so that it is possible to obtain a nonvolatile semiconductor storage device which is excellent in signal charge holding property.

Furthermore, in the case of where the thermal insulating film having coated silicon grains is removed once and then another thermal insulating film is provided again to cover the silicon grains which have been made thin, the silicon grains are coated with the thermal insulating film so that the insulating property between the silicon grains is further improved.

Furthermore, in the case of where the silicon grains in the polysilicon film are coated with a thermal insulating film after impurity has been doped into the polysilicon film, so that a depletion layer is hardly generated in the silicon grains when a writing voltage is applied to the charge trap film. Consequently, an electric field to be applied to the silicon grains is reduced, and, on the other hand, partial voltages to be applied to the insulating film on the semiconductor substrate and the thermal insulating film covering the silicon grains can be made high to thereby improve the injection efficiency of carriers to the silicon grains so as to reduce the writing voltage.

DETAILED DESCRIPTION OF THE PREFERRED EMBODIMENT

Referring to the accompanying drawings, an embodiment of the present invention will be described hereunder.

Figure 1:
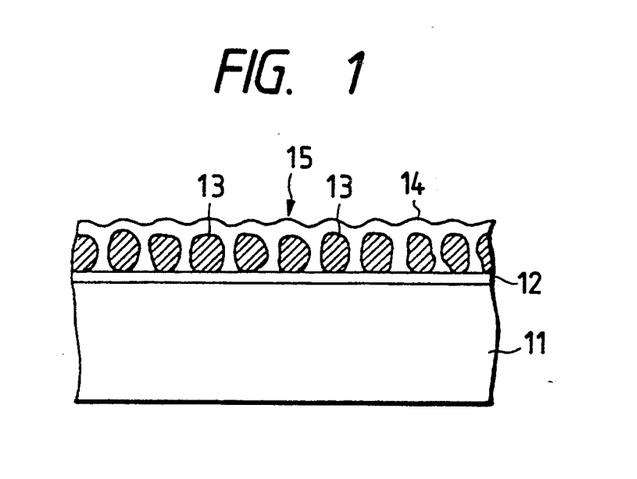
FIG. 1 is a section showing the structure of a charge trap film according to an embodiment of the present invention.

FIG. 1 is a sectional view showing the structure of the charge trap film according to an embodiment of the present invention.

In the drawing, the reference numeral 11 designates a silicon substrate. A tunnel oxide film 12 acting as an insulating film is formed on the silicon substrate 11. A large number of silicon grains 13 acting as the center of trap of signal charges exist on the tunnel oxide film 12 and coated, for example, with a thermal oxide film 14 so as to be insulated from each other. Further, a thermal silicon nitride film may be used in place of each of the foregoing tunnel oxide film 12 and the thermal oxide film 14.

Since the thermal insulating film such as a thermal oxide film or a thermal silicon nitride film has a higher insulating property than an insulating film formed by a sputtering or CVD method, the silicon grains 13 are satisfactorily insulated from each other, from the silicon substrate 11, and from a gate electrode (not shown) to be formed on a charge trap film 15. If the charge trap film 15 is too thin, it is sometimes difficult to secure the insulating property even though the silicon grains 13 are coated with the thermal oxide film 14. In such a case, it will do to make the charge trap film 15 have a multi-layer structure as shown in FIG. 2.

Figure 2:
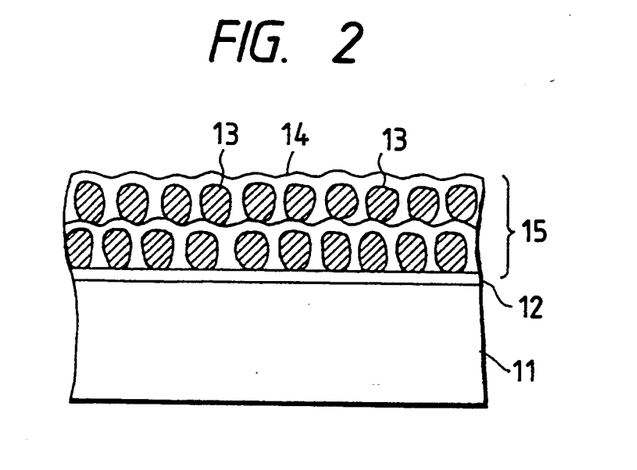
FIG. 2 is a section showing the structure of a multi-layer charge trap film.

When a writing voltage is applied to the charge trap film as shown in FIG. 1 or 2, there is such a possibility that a depletion layer is generated in each of the silicon grains 13 to thereby change the dielectric constant of the charge trap film 15. When the dielectric constant of the charge trap film 15 is changed, an electric field to be applied to the tunnel oxide film 12 is reduced to thereby reduce the writing efficiency and therefore there is a disadvantage in that it is necessary to set the writing voltage to be high. Further, the potential on the channel surface of a transistor is changed and therefore there is a disadvantage in that the threshold of the transistor is varied. Then, it is preferable to dope an impurity such as phosphorus or the like into the silicon grains 13 to thereby increase the conductivity of the silicon grains 13 so as to suppress generation of depletion layers.

Figure 3:
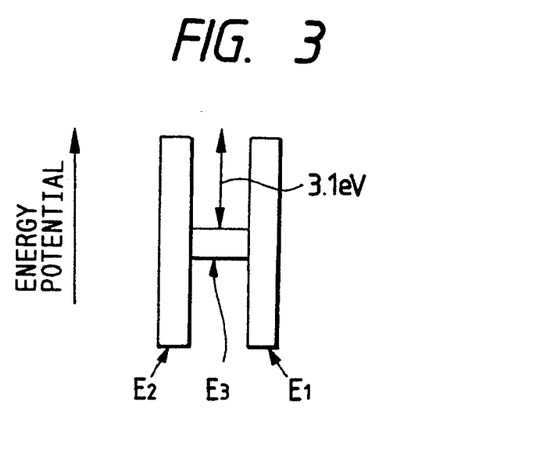
FIG. 3 is a diagram showing the band structure of the charge trap film according to the foregoing embodiment.

FIG. 3 shows the energy band structure of the foregoing charge trap film 15. In the drawing, the $E_1$ and $E_2$ designate the energy bands of the tunnel oxide film 12 and thermal oxide film 14 respectively and $E_3$ designates the energy band of the silicon grains 13. The interband barrier between the silicon grains 13 and the oxide films 12 and 14 is about 3.1 eV. Since the trap level of the charge trap film 15 according to this embodiment is sufficiently deep although the trap level of the silicon nitride film is about 0.3 eV and it can be understood that the signal charge holding property of the charge trap film 15 is improved in comparison with a case where a silicon nitride film is used as the charge trap film.

Next, an example of the method of producing the abovementioned charge trap film will be described with reference to FIG. 4.

Figure 4A:
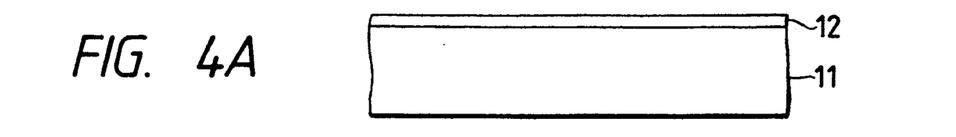
FIGS. 4A to 4F are diagrams for explaining a method of producing the charge trap film according to the foregoing embodiment.

First, a tunnel oxide film 12 of about 100Å is formed on a silicon substrate 11 through thermal oxidation as shown in the diagram of FIG. 4A.

Figure 4B:
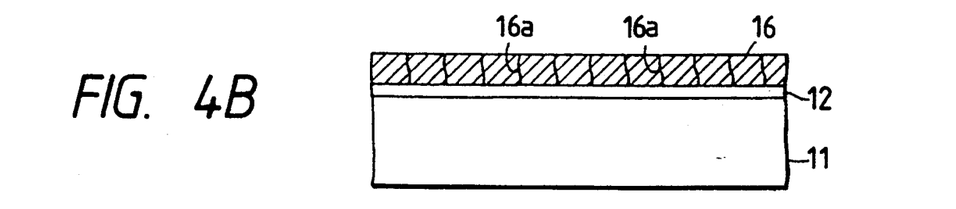

Next, a thin polysilicon film 16 is deposited on the tunnel oxide film 12 by a decompression CVD method as shown in the diagram of FIG. 4B. Specifically, $SiH_4$ is thermally decomposed in a temperature atmosphere of about 570° C. so as to deposit the polysilicon film 16 of about 600Å. It is not preferable to deposit the polysilicon film 16 thickly. This is because in the succeeding thermal oxidation step, there is such a possibility that oxygen atoms become difficult to diffuse inside along the crystal grain boundaries 16a of the poly silicon film 16 so that the insulation of the silicon grains 13 becomes insufficient in the inside of the polysilicon film 16.

In the initial stage of depositing the polysilicon film 16, nuclei of polysilicon are produced so that silicon grains 13 grow about the nuclei through epitaxial growth or migration. Therefore, in the stage where the polysilicon film 16 is thin, the grain boundaries 16a pass vertically through the polysilicon film 16 as shown in the diagram of FIG. 4B. Since the grain boundaries are lattice non-alignment planes, the diffusion rate of oxygen atoms in the grain boundaries is higher than that in the inside of the silicon grains 13. Consequently, when oxidation is performed in this state, the oxidation advances not only in the upper surface of the polysilicon surface 16 but in the side surface along the grain boundaries 16a, so that the silicon grains 13 are perfectly coated with the thermal oxide film 14.

Figure 4C:
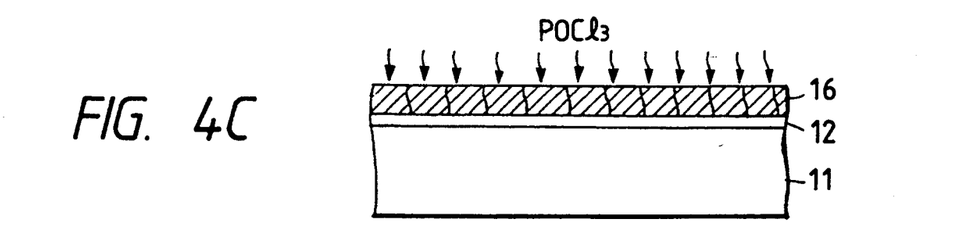

After the polysilicon film 16 has been deposited, a $POCl_3$ gas is supplied, as shown in the diagram of FIG. 4C, in a temperature atmosphere of about 900° C. so that phosphorus is doped into the polysilicon film 16 to thereby increase the conductivity of the polysilicon film 16. This reason is as described above.

Figure 4D:
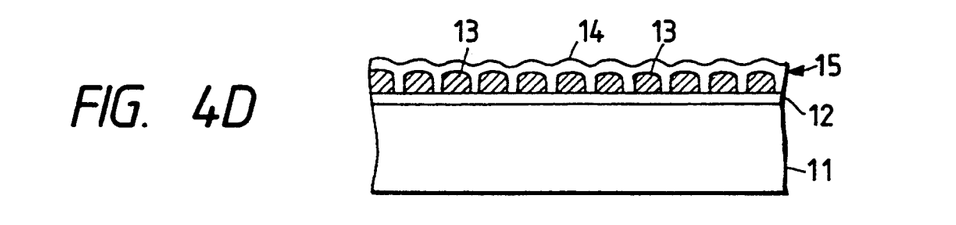

Next, wet oxidation is performed in an atmosphere of about 900° C. so that the silicon grains 13 in the polysilicon film 16 are subject to thermal oxidation to thereby form the thermal oxide film 14 of about 300Å on the surface of the silicon grains 13 as shown in the diagram of FIG. 4D. Thus, such a charge trap film 15 as illustrated in FIG. 1 is formed through the steps to this point.

Figure 4E:
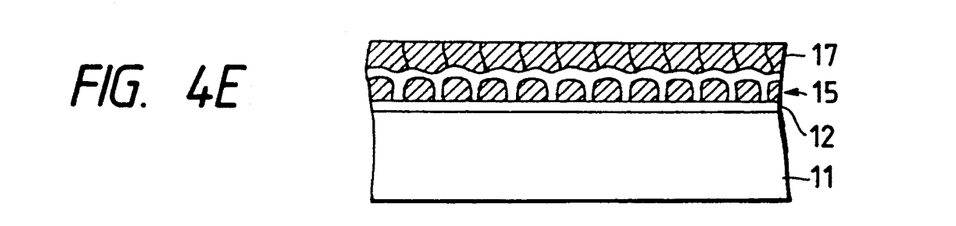
Figure 4F:
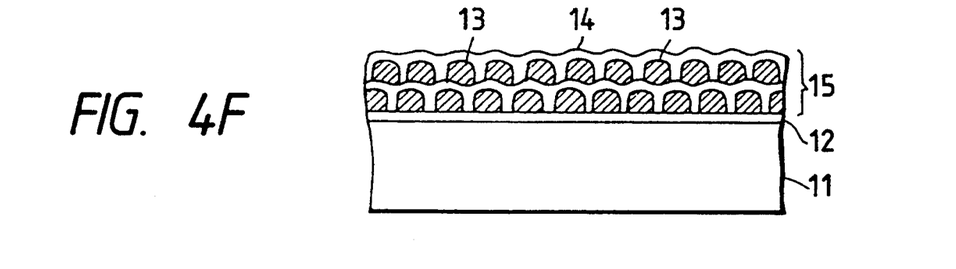

When such a multilayer charge trap film 15 as illustrated in FIG. 2 is to be produced, a thin polysilicon film 17 is deposited again after the thermal oxide film 14 has been formed as shown in the diagram of FIG. 4E. Then, the phosphorus doping step (the diagram of FIG. 4C) and the thermal oxidation step (the diagram of FIG. 4D) are carried out so as to obtain such a multilayer charge trap film 15 as shown in the diagram of FIG. 4F.

Figure 5A:
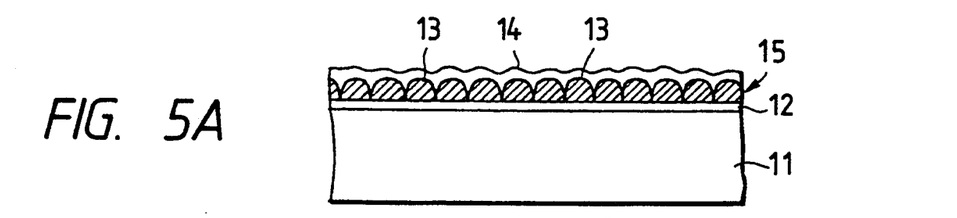
FIGS. 5A to 5C are diagrams for explaining another embodiment of the method of producing a charge trap film.
Figure 5B:
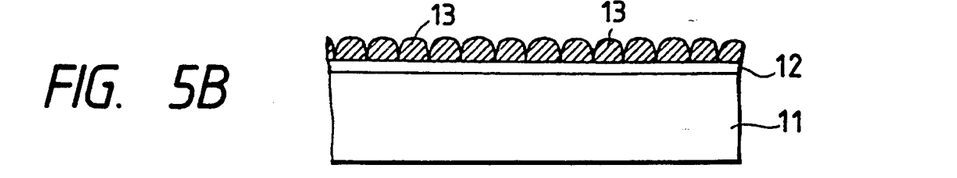
Figure 5C:
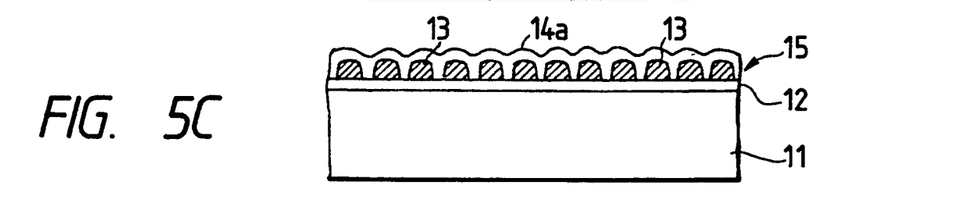

FIG. 5 shows a producing method for making the mutual insulating property of the silicon grains 13 in the charge trap film 15 surer. That is, the diagram of FIG. 5A shows the charge trap film 15 obtained through the steps shown in the diagrams of FIGS. 4A to 4D. Here, the thermal oxide film 14 is removed with a diluted HF solution as shown in the diagram of FIG. 5B. Then, the substrate is subject to thermal oxidation again so as to form a new thermal oxide film 14 on the surface of the silicon grains 13 as shown in the diagram of FIG. 5C. As a result, the silicon grains 13 are thinned and the respective circumferences of the thinned silicon grains are coated with the thermal oxide film 14a to thereby further improve the insulating property between the silicon grains 13.

In the case of using a thermal silicon nitride film in place of the tunnel oxide film 12 and the thermal oxide film 14, it will do to treat the silicon substrate 11 or a substrate having the polysilicon film 16 at a high temperature in an atmosphere of $N_2$, $NH_3$, or the like.

Figure 6:
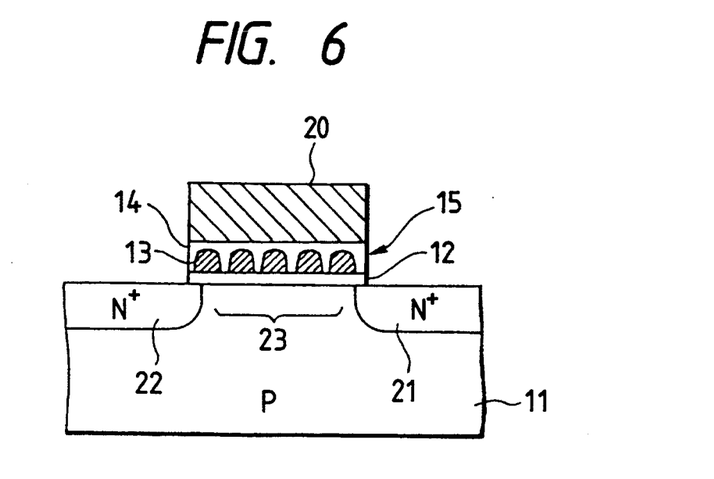
FIG. 6 is a section showing the structure of a nonvolatile memory using the charge trap film according to the foregoing embodiment.

Next, referring to FIG. 6, the structure of a nonvolatile memory using the charge trap film according to the foregoing embodiment will be described.

The nonvolatile memory has such a gate structure that a thermal oxide film 12, a charge trap film 15, and a gate electrode 20 are laminated on a P-type silicon substrate 11 and drain and source diffusion layers 21 and 22 which are N+ regions are formed in the substrate on the opposite sides of the gate structure. The charge trap film 15 has such a configuration as illustrated in FIG. 1 or 2.

Write/erase/read of signal charges into/from the nonvolatile memory is performed as follows. In writing signal charges, a positive high voltage is applied to the gate electrode 20 and a channel region 23 is grounded. As a result, electrons in the channel region 23 are made to have high energy by an electric field generated between the gate electrode 20 and the channel region 23. Some electrons tunnel through the tunnel oxide film 12 so as to be injected into the charge trap film 15 so as to be trapped by the silicon grains 13 in the charge trap film 15. As a result, the threshold of the nonvolatile memory transistor is shifted to a high value side as shown in FIG. 7.

In erasing signal charges, a positive high voltage is applied to the channel region 23 to thereby generate an electric field in the direction opposite to that in writing signal charges so that the electrons trapped by the silicon grains 13 are returned to the channel region 23. As a result, the threshold of the nonvolatile memory is return to the initial state as shown in FIG. 7.

Figures 7, 8A:
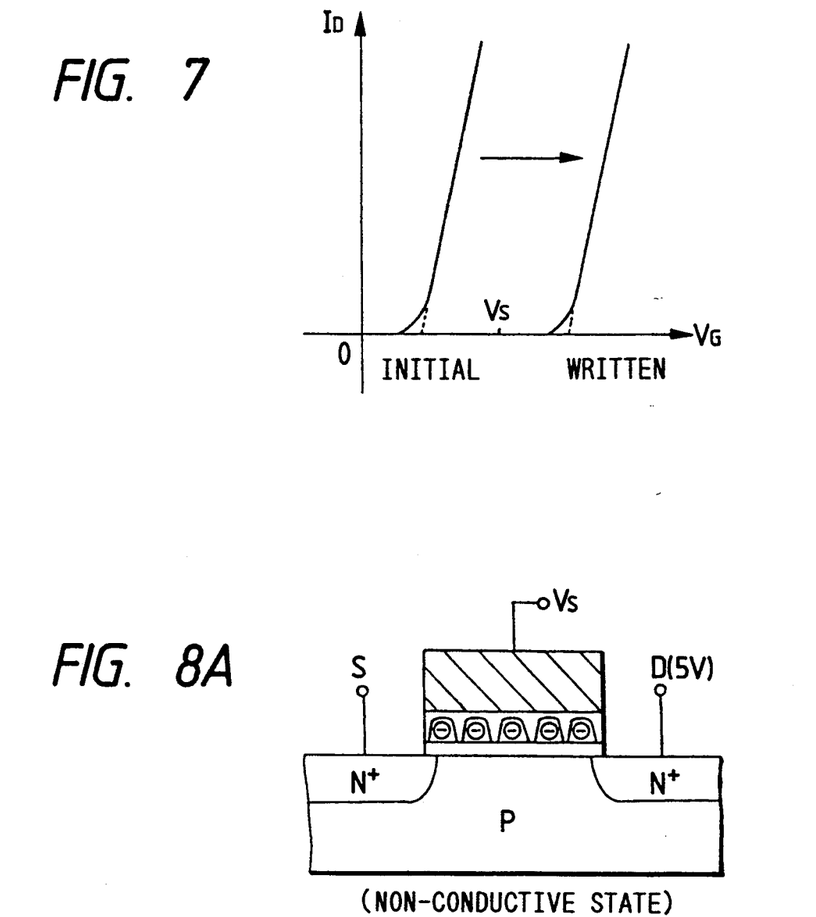
FIG. 7 is a diagram for explaining a shifting state of the threshold beforehand after writing in nonvolatile memory.
FIGS. 8A and 8B are diagrams for explaining the reading operation of the nonvolatile memory of FIG. 6.
Figure 8B:
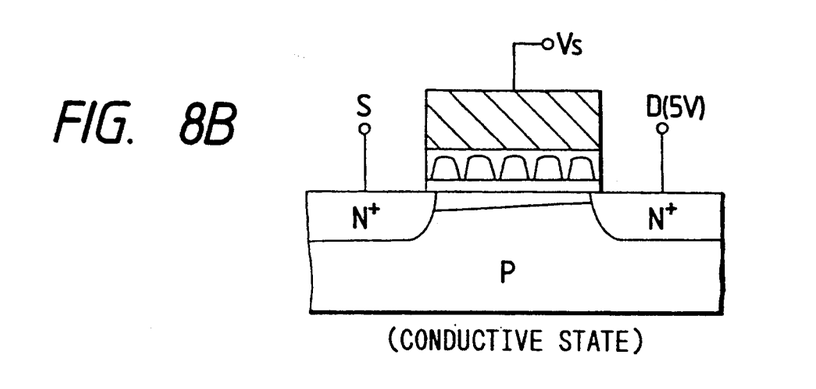

Reading signal charges is performed by applying a voltage $V_s$ having an intermediate value between the threshold of the initial state and the threshold after writing shown in FIG. 7 to the gate electrode 20 and by applying a positive voltage (for example, about 5 V) to the drain diffusion region 21. In the state where electrons are trapped by the silicon grains 13, no channel is formed between the source and the drain to thereby realize a non-conductive state as shown in the diagram of FIG. 8A. This state is read as data "0". In the state where no electrons are trapped by the silicon grains 13, a channel is formed between the source and the drain to thereby realize a conductive state. This state is read as data "1".

Next, referring to FIG. 9, a method of producing the nonvolatile memory of FIG. 6 will be described.

Figure 9A:
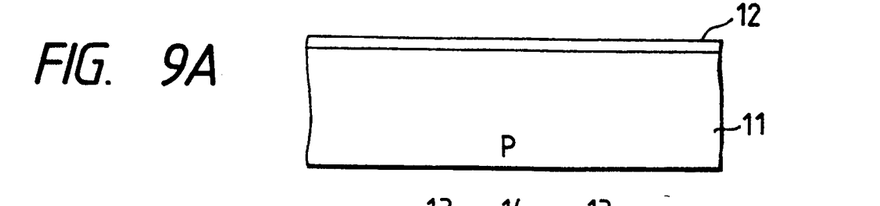
FIGS. 9A to 9D are diagrams for explaining a method of producing the nonvolatile memory of FIG. 6.
Figure 9B:
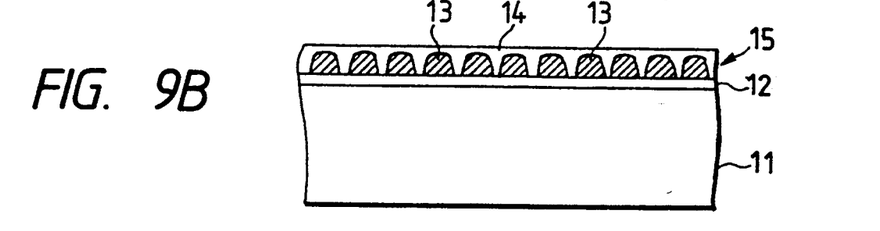
Figure 9C:
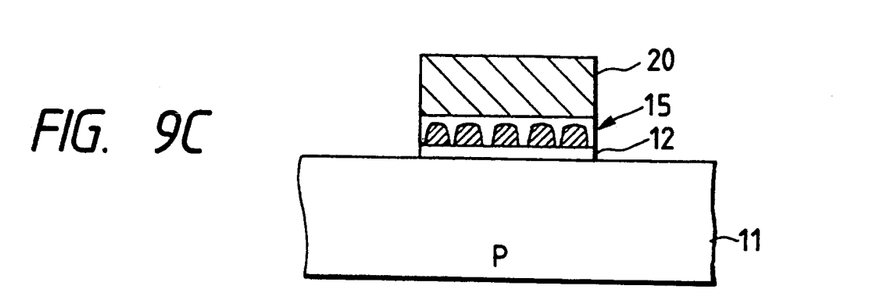
Figure 9D:
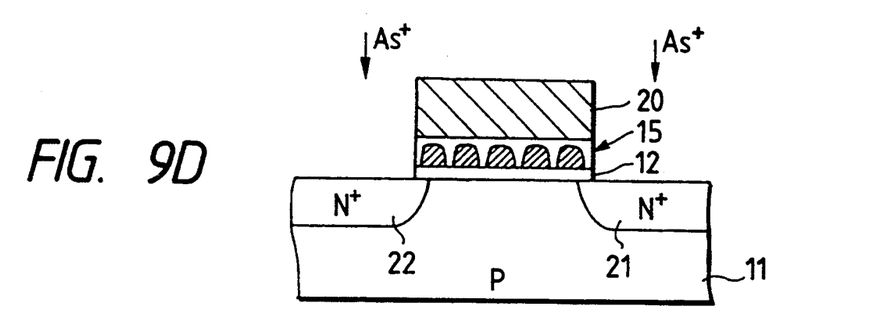

First, a device region is separation-formed on a silicon substrate by an LOCOS (local oxidation of silicon) method and a tunnel oxide film 12 of about 20Å is formed on a P-type silicon substrate 11 as shown in the diagram of FIG. 9A. Then, a charge trap film 15 of about 200Å is deposited on the tunnel oxide film 12 as shown in the diagram of FIG. 9B. The method of producing the charge trap film 15 has been described with reference to FIGS. 4A to 4F and 5A to 5C and therefore the explanation thereof is omitted here. Then, a polysilicon film of about 4000Å acting as a gate electrode is deposited on the charge trap film 15 and an impurity such as phosphorus or the like is doped to there by apply conductivity. Next, the tunnel oxide film 12, the charge trap film 15, and the polysilicon film are patterned by a photoetching method to thereby form a gate structure as shown in the diagram of FIG. 9C. An N-type impurity such as arsenic or the like is ion-injected into the silicon substrate 11 using the gate structure as a mask so that drain and source diffusion layers 21 and 22 are formed through self alignment.

Although a nonvolatile memory of an N-channel type having a charge trap film which is the gist of the present invention has been described in the foregoing embodiment, it is of course that the present invention can be applied to a nonvolatile memory of a P-channel type.

As apparent from the foregoing description, according to the present invention, there are the following effects.

According to the present invention, it is possible to obtain a semiconductor storage device having a charge trap film in which silicon crystal particles in a polysilicon film are coated with a thermal insulating film. The thermal insulating film covering the silicon crystal particles in the polysilicon film is excellent in film quality compared with an insulating film obtained by a sputtering or CVD method so that it has a high dielectric withstanding voltage. Further the silicon crystal particles coated with the thermal insulating film have a deep trap level so that it is possible to obtain a nonvolatile semiconductor storage device which is excellent in signal charge holding property.

Furthermore, in the case of where the thermal insulating film having coated silicon grains is removed once and then another thermal insulating film is provided again to cover the silicon grains which have been made thin, the silicon grains are coated with the thermal insulating film so that the insulating property between the silicon grains is further improved.

Furthermore, in the case of where the silicon grains in the polysilicon film are coated with a thermal insulating film after impurity has been doped into the polysilicon film, so that a depletion layer is hardly generated in the silicon grains when a writing voltage is applied to the charge trap film. Consequently, an electric field to be applied to the silicon grains is reduced, and, on the other hand, partial voltages to be applied to the insulating film on the semiconductor substrate and the thermal insulating film covering the silicon grains can be made high to thereby improve the injection efficiency of carriers to the silicon grains so as to reduce the writing voltage.

What is claimed is:

1. A nonvolatile semiconductor storage device comprising:
    a gate structure in which an insulating film, a charge trap film, and a conductive film are stacked on a substrate; and
    drain and source diffusion layers formed in said substrate at opposite sides of said gate structure, whereby a charge is held in said charge trap film to thereby store information,
    wherein said charge trap film includes a polysilicon film having a plurality of silicon crystal grains, each grain being coated with a thermal insulating film so as to isolate the crystal grains from each other.

2. A nonvolatile semiconductor storage device as claimed in claim 1, wherein said thermal insulating film is one of a thermal silicon oxide film and a thermal silicon nitride film.

3. A charge trap film formed on a semiconductor substrate, said charge trap film comprising a plurality of silicon crystal grains in a polysilicon film, each of said silicon crystal grains being coated with a thermal insulating film so as to isolate the crystal grains from each other.

4. A charge trap film as claimed in claim 3, wherein said thermal insulating film is one of a thermal silicon oxide film and a thermal silicon nitride film.

5. A nonvolatile semiconductor storage device as claimed in claim 1, wherein the charge trap film comprises a multilayer film.

6. A charge trap film as claimed in claim 3, wherein the charge trap film comprises a multilayer film.

* * * * *